(12) United States Patent
Lin et al.

(10) Patent No.: US 8,105,928 B2
(45) Date of Patent: Jan. 31, 2012

(54) GRAPHENE BASED SWITCHING DEVICE HAVING A TUNABLE BANDGAP

(75) Inventors: Yu-Ming Lin, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 12/612,018

(22) Filed: Nov. 4, 2009

(65) Prior Publication Data

US 2011/0101309 A1    May 5, 2011

(51) Int. Cl.
*H01L 21/24* (2006.01)
*H01L 29/06* (2006.01)
*G05F 3/02* (2006.01)

(52) U.S. Cl. .............. 438/539; 438/590; 257/9; 257/29; 257/E29.168; 365/148; 330/100; 330/186; 327/539

(58) Field of Classification Search ....... 257/9, E29.168, 257/29; 438/590, 539; 327/539; 356/237.1; 330/100, 186; 365/148
See application file for complete search history.

(56) References Cited

U.S. PATENT DOCUMENTS

| 2006/0086977 | A1* | 4/2006 | Shah et al. ..................... 257/347 |
| 2009/0020399 | A1 | 1/2009 | Kim et al. |
| 2009/0020764 | A1 | 1/2009 | Anderson et al. |
| 2009/0140801 | A1 | 6/2009 | Ozyilmaz et al. |
| 2009/0181502 | A1 | 7/2009 | Parikh et al. |
| 2011/0006837 | A1* | 1/2011 | Wang et al. ..................... 327/539 |

OTHER PUBLICATIONS

E. V. Castro et al.; "Biased Bilayer Graphene: Semiconductor with a Gap Tunable by the Electric Field Effect;" Physical Review Letters 99; Nov. 22, 2007; pp. 216802-1-216082-4.
J. B. Oostinga et al.; "Gate-induced insulating state in bilayer graphene devices;" Nature Materials, vol. 7, Feb. 2008; pp. 151-157.
H. Raza et al.; "Field modulation in bilayer graphene band structure;" Journal of Physics: Condensed Matter 21 (2009); pp. 1-4.

* cited by examiner

*Primary Examiner* — Long Tran
(74) *Attorney, Agent, or Firm* — Cantor Colburn LLP; Vazken Alexanian

(57) ABSTRACT

A method of implementing bandgap tuning of a graphene-based switching device includes subjecting a bi-layer graphene to an electric field while simultaneously subjecting the bi-layer graphene to an applied strain that reduces an interlayer spacing between the bi-layer graphene, thereby creating a bandgap in the bi-layer graphene.

9 Claims, 12 Drawing Sheets

GRAPHENE BASED SWITCHING DEVICE HAVING A TUNABLE BANDGAP

BACKGROUND

The present invention relates generally to semiconductor devices and, more particularly, to a graphene based, electronic switching device having a tunable bandgap.

Graphene refers to a two-dimensional planar sheet of carbon atoms arranged in a hexagonal benzene-ring structure. A free-standing graphene structure is theoretically stable only in a two-dimensional space, which implies that a truly planar graphene structure does not exist in a three-dimensional space, being unstable with respect to formation of curved structures such as soot, fullerenes, nanotubes or buckled two dimensional structures. However, a two-dimensional graphene structure may be stable when supported on a substrate, for example, on the surface of a silicon carbide (SiC) crystal. Free standing graphene films have also been produced, but they may not have the idealized flat geometry.

Structurally, graphene has hybrid orbitals formed by $sp^2$ hybridization. In the $sp^2$ hybridization, the 2s orbital and two of the three 2p orbitals mix to form three $sp^2$ orbitals. The one remaining p-orbital forms a pi ($\pi$)-bond between the carbon atoms. Similar to the structure of benzene, the structure of graphene has a conjugated ring of the p-orbitals, i.e., the graphene structure is aromatic. Unlike other allotropes of carbon such as diamond, amorphous carbon, carbon nanofoam, or fullerenes, graphene is only one atomic layer thin.

Graphene has an unusual band structure in which conical electron and hole pockets meet only at the K-points of the Brillouin zone in momentum space. The energy of the charge carriers, i.e., electrons or holes, has a linear dependence on the momentum of the carriers. As a consequence, the carriers behave as relativistic Dirac-Fermions with a zero effective mass and are governed by Dirac's equation. Graphene sheets may have a large carrier mobility of greater than 200,000 $cm^2$/V-sec at 4K. Even at 300K, the carrier mobility can be as high as 15,000 $cm^2$/V-sec.

Graphene layers may be grown by solid-state graphitization, i.e., by sublimating silicon atoms from a surface of a silicon carbide crystal, such as the (0001) surface. At about 1,150° C., a complex pattern of surface reconstruction begins to appear at an initial stage of graphitization. Typically, a higher temperature is needed to form a graphene layer. Graphene layers on another material are also known in the art. For example, single or several layers of graphene may be formed on a metal surface, such as copper and nickel, by chemical deposition of carbon atoms from a carbon-rich precursor.

Graphene displays many other advantageous electrical properties such as electronic coherence at near room temperature and quantum interference effects. Ballistic transport properties in small scale structures are also expected in graphene layers.

While single-layer graphene sheet has a zero band-gap with linear energy-momentum relation for carriers, two-layer graphene, i.e. bi-layer graphene, exhibits drastically different electronic properties, in which a band gap may be created under special conditions. In a bi-layer graphene, two graphene sheets are stacked on each other with a normal stacking distance of roughly 3.35 angstrom, and the second layer is rotated with respect to the first layer by 60 degree. This stacking structure is the so-called A-B Bernel stacking, and is also the graphene structure found in natural graphite. Similar to single-layer graphene, bi-layer graphene has zero-band gap in its natural state. However, by subjecting the bi-layer graphene to an electric field, a charge imbalance can be induced between the two layers, and this will lead to a different band structure with a band gap proportional to the charge imbalance.

SUMMARY

In an exemplary embodiment, a method of implementing bandgap tuning of a graphene-based switching device subjecting a bi-layer graphene to an electric field while simultaneously subjecting the bi-layer graphene to an applied strain that reduces an interlayer spacing between the bi-layer graphene, thereby creating a bandgap in the bi-layer graphene.

In another embodiment, a graphene-based switching device includes a bottom gate electrode disposed on a substrate; a bottom gate dielectric layer disposed over the bottom electrode, the lower dielectric layer having ferroelectric and piezoelectric properties; a bi-layer graphene disposed over the bottom gate dielectric layer; and a top gate electrode disposed over the bi-layer graphene, wherein an applied voltage across the top and bottom gate electrodes results in subjecting the bi-layer graphene to an electric field while simultaneously subjecting the bi-layer graphene to an applied strain that reduces an interlayer spacing between the bi-layer graphene, thereby creating a bandgap in the bi-layer graphene.

In still another embodiment, a method of forming a graphene-based switching device includes forming a template layer on a substrate, the template layer selected to facilitate single crystal growth of subsequent material formed thereupon; patterning a resist layer on a portion of the template layer corresponding to a location of a subsequent field effect transistor (FET) channel region; forming an amorphous layer over the template layer and patterned resist layer, and thereafter removing the patterned resist layer so as to expose the portion of the template layer corresponding to the channel region; forming a bottom electrode layer over the amorphous layer and the exposed portion of the template layer, wherein portions of the bottom electrode layer on the template layer are crystalline in structure and electrically conductive, while portions of the bottom electrode layer on the amorphous layer are amorphous and insulating; forming a bottom gate dielectric layer over the bottom electrode layer, wherein portions of the bottom gate dielectric layer on the crystalline bottom electrode layer are crystalline in structure and exhibit ferroelectric and piezoelectric properties, while portions of the bottom gate dielectric layer on the amorphous bottom electrode layer are amorphous, non-ferroelectric and non-piezoelectric; forming a bi-layer graphene over the bottom gate dielectric layer; forming source and drain contact electrodes at opposing ends of the bi-layer graphene, the bi-layer graphene defining the FET channel region; forming a top gate dielectric layer over the bi-layer graphene; and forming a top gate electrode over the top gate dielectric layer.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 1A:
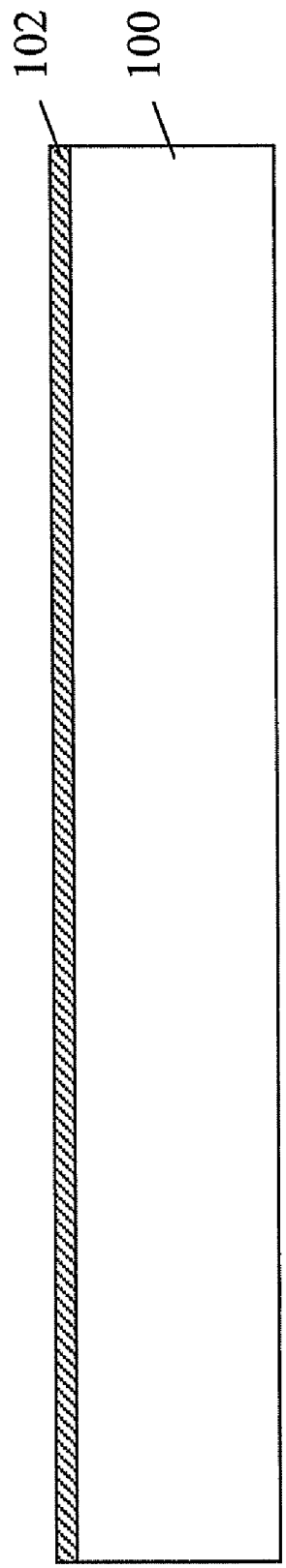
FIGS. 1(a) through 1(j) are a sequence of cross-sectional views illustrating an exemplary method of forming a graphene based, electronic switching device having a tunable bandgap, in accordance with an embodiment of the invention.
Figure 1B:
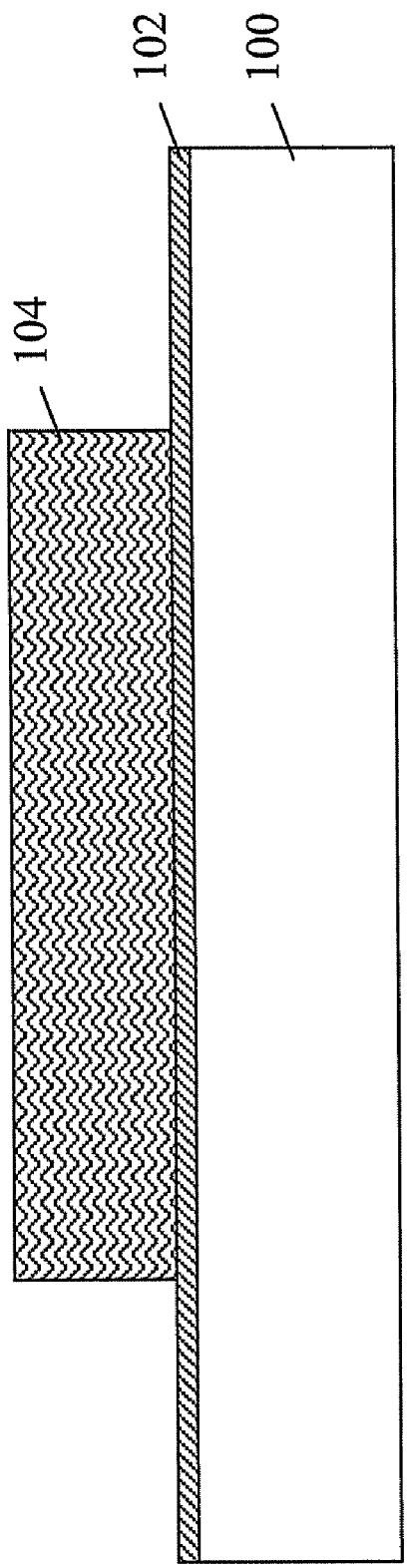

As indicated above, graphene possesses great potential for high-speed electronics because of its high carrier mobility and the ultra-thin body thickness, which is only one atom layer thin. However, one major disadvantage of using graphene for high-speed digital switches is the small on/off ratio (about 10) in graphene field-effect devices. This low on/off ratio results from the absence of an energy gap between the conduction and valence bands in the graphene band structure.

One approach to creating an energy gap in graphene is to cut the graphene into very narrow ribbons. In graphene nanoribbons, electrons are confined in the lateral direction, and in theory, a bandgap inversely proportional to the ribbon width can be induced by quantum confinement effects. The experimental demonstration of this idea, however, shows that the transport in these nanoribbons is adversely affected and dominated by the edge roughness. In addition, the width required to produce a practically useful bandgap is predicted to be below 10 nanometers (nm), which would be difficult to achieve even with state-of-the-art lithographical and graphene etching technologies. Therefore, the realization of a graphene field-effect device having a practical bandgap remains a major challenge.

Accordingly, disclosed herein is a new, scalable process and structure for producing a tunable bandgap in graphene in order to produce high on/off ratio graphene transistors without sophisticated lithography and etching of graphene nanoribbons. Briefly stated, the embodiments herein utilize the unique properties of bi-layer graphene to induce a bandgap by a novel combination of strain and electric field. Bi-layer graphene comprises two stacked graphene sheets having an interlayer spacing therebetween of about 0.34 nm, and which is also a zero gap semiconductor under normal conditions. However, by applying an external electric field between the two layers, a bandgap as large as 0.3 electron volts (eV) can be induced. This bandgap opening may be further enhanced by also applying an external strain that decreases the interlayer spacing.

In the embodiments described herein, a ferroelectric/piezoelectric dielectric material is used to simultaneously induce an external electric field and strain, thereby creating the bandgap in the bi-layer graphene structure. More specifically, a graphene transistor is fabricated on a pre-patterned substrate that includes a layer of ferroelectric dielectric material. In one exemplary embodiment, a suitable ferroelectric dielectric material is lead zirconate titanate ($Pb[Zr_xTi_{1-x}]O_3$ $0 \leq x \leq 1$, or PZT by its chemical formula).

PZT is a ceramic material with a perovskite crystal structure that shows substantial ferroelectricity, i.e., generation of spontaneous electric polarization (electric dipoles) in the presence of an electric field. PZT is also a piezoelectric material, meaning that a voltage difference is developed across opposing surfaces when compressed. Conversely, a physical deformation of the PZT material is induced upon application of an external electric field. PZT has been extensively utilized in both bulk and thin film structures in devices/applications such as sensors, actuators, and ultrasonic transducers. It has also been demonstrated that smooth PZT films may be achieved through proper deposition conditions, thus allowing for a subsequent graphene transfer onto the substrate. Here, both the ferroelectricity and piezoelectricity of PZT are utilized to achieve bandgap modulation in bi-layer graphene through effects of electrostatics and strain.

In addition to a bottom gate electrode upon which a PZT dielectric is formed, a top gate electrode is also fabricated above the active graphene channel. Since the bi-layer graphene is sandwiched between the two gate electrodes, an electric field may be induced by controlling the gate voltages of the top and bottom gate electrodes. In contrast to a conventional oxide gate dielectric material (e.g. $SiO_2$), a ferroelectric PZT dielectric layer allows for a much higher electric field (e.g., up to about $4.5 \times 10^8$ V/cm) at the graphene channel. In comparison, the breakdown field of the commonly used oxide material $SiO_2$ is only about $1 \times 10^7$ V/cm. Since the bandgap opening in bi-layer graphene is proportional to the electric field, this enhanced field is advantageous for achieving a larger bandgap. Furthermore, the use of PZT as the bottom gate dielectric enables the interlayer spacing between the bi-layer graphene sheets to be modulated by the electric field within the dielectric. By combining of the strain and the enhanced electric field in bi-layer graphenes, a large bandgap can be induced in a graphene channel, leading to higher on/off ratios required for digital switching applications.

Referring generally now to FIGS. 1(a) through 1(j), there is shown a sequence of cross-sectional views illustrating an exemplary method of forming a graphene based, electronic switching device having a tunable bandgap, in accordance with an embodiment of the invention. Beginning in FIG. 1(a), a substrate 100 (e.g., undoped silicon) has a thin template layer 102 formed thereupon. The template layer 102 may be, for example, a thin layer of pseudomorphic $SrTiO_3$ (strontium titanate or STO), in which STO layer facilitates single crystal growth of subsequent materials formed thereon. The template layer 102 may be deposited using any methods that can achieve atomically smooth epitaxy, including, for example, molecular beam epitaxy (MBE), atomic layer deposition (ALD), etc. As then shown in FIG. 1(b), an active graphene channel region is lithographically defined by patterning a resist layer 104 formed upon the template layer 102. The resist layer 104 may comprise, for example, a photoresist layer or an electron beam (e-beam) resist layer.

Figure 1C:
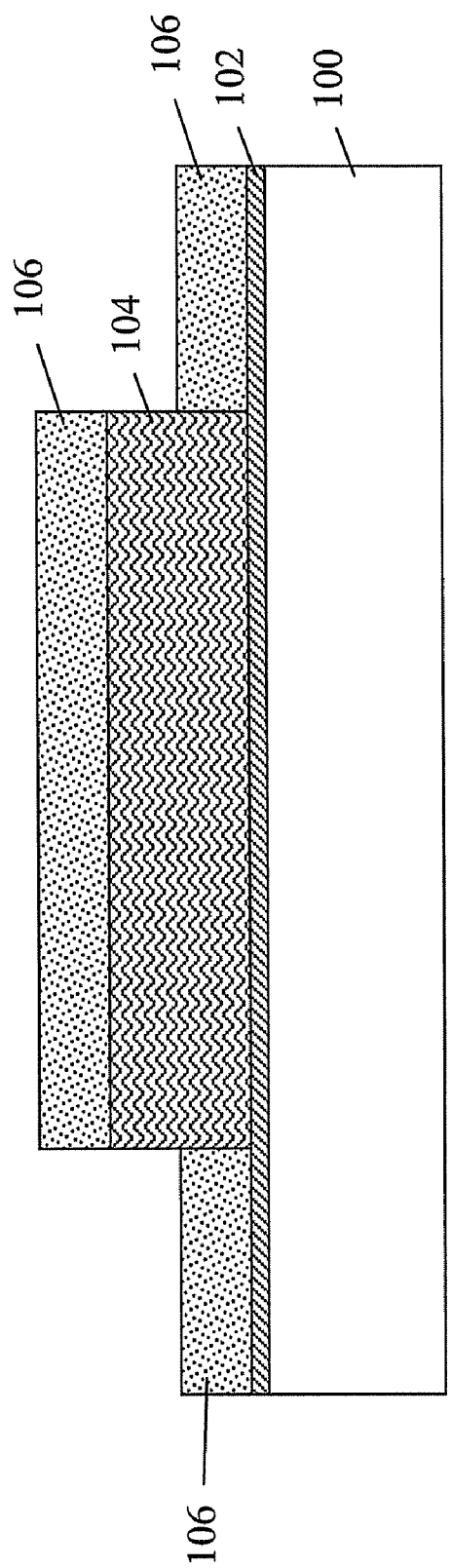
Figure 1D:
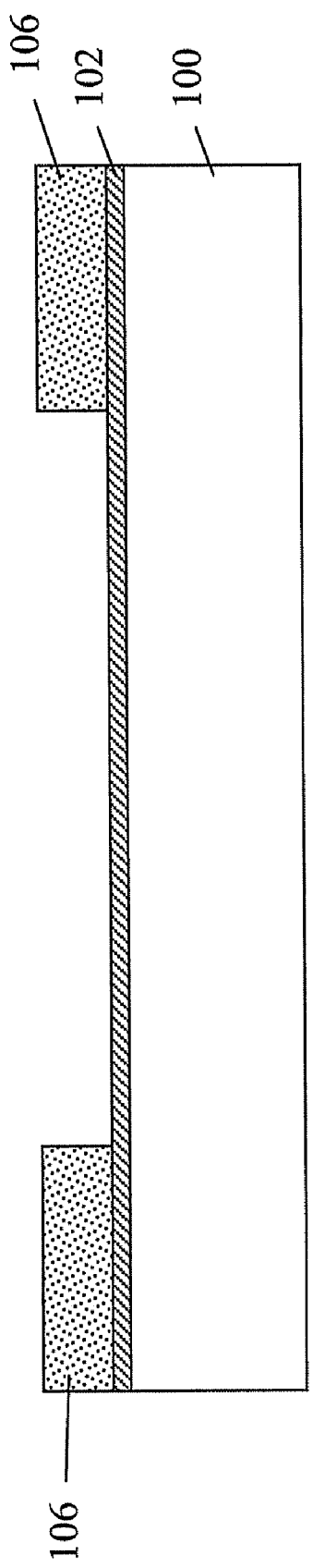

Referring next to FIG. 1(c), an amorphous film 106 (e.g., titanium) is deposited over the template layer 102 and patterned resist layer 104 by, for example, plasma sputtering. As can be seen, the resist layer 104 protects the portion of the template layer 102 corresponding to the subsequently formed active graphene channel region. Elsewhere, the amorphous layer 106 covers the template layer 102. In addition to titanium (Ti), other amorphous materials may also be used for the layer 106, so long as the associated process does not thermally or chemically affect the integrity of the resist layer 104, including leaving sidewalls of the resist layer 104 exposed to enable removal thereof. The removal of the resist layer 104 and portions of the amorphous layer 106 directly thereon is depicted in FIG. 1(d). From this point, subsequent layers formed over the device will take on an amorphous (electrically insulating or non-ferroelectric/non-piezoelectric) form over regions corresponding to the amorphous layer 106 and a crystalline (electrically conductive or ferroelectric/piezoelectric) form over regions corresponding to the exposed template layer 102.

Figure 1E:
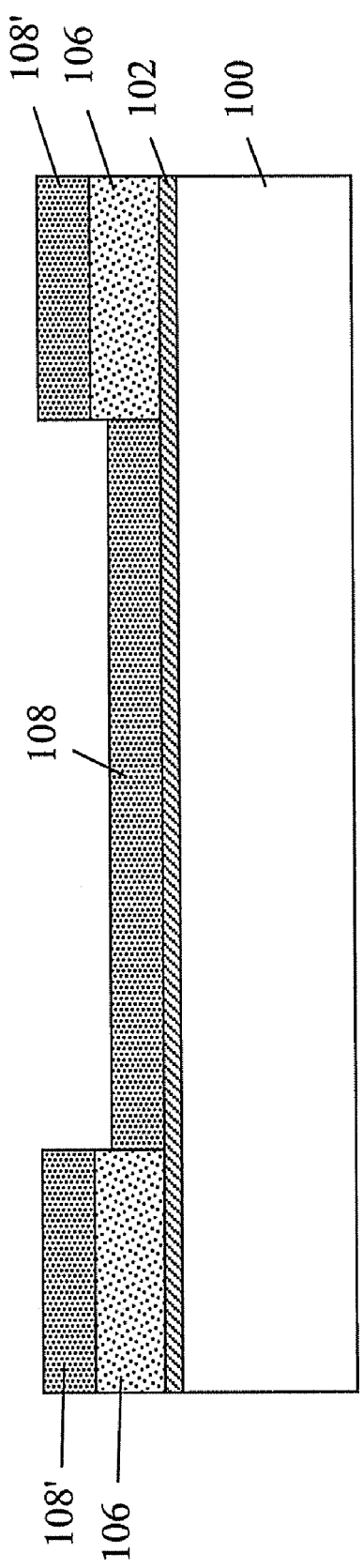

Proceeding to FIG. 1(e), a bottom electrode layer is formed over the device. The bottom electrode layer may be, for example, $LaSrMnO_3$ (lanthanum strontium manganite or LSMO) or any other metallic complex oxides such as $LaCaMnO_3$ (lanthanum calcium manganite), deposited by plasma sputtering. As indicated above, the portions 108 of the LSMO layer deposited directly on the template layer 102 are crystalline in structure and electrically conductive, while the portions 108' of the LSMO layer deposited on the amorphous Ti layer 106 become themselves amorphous and electrically insulating. Thus, the amorphous LSMO layer 108' is an insulator, while the crystalline LSMO layer 108 defines the bottom gate electrode of the device.

Figure 1F:
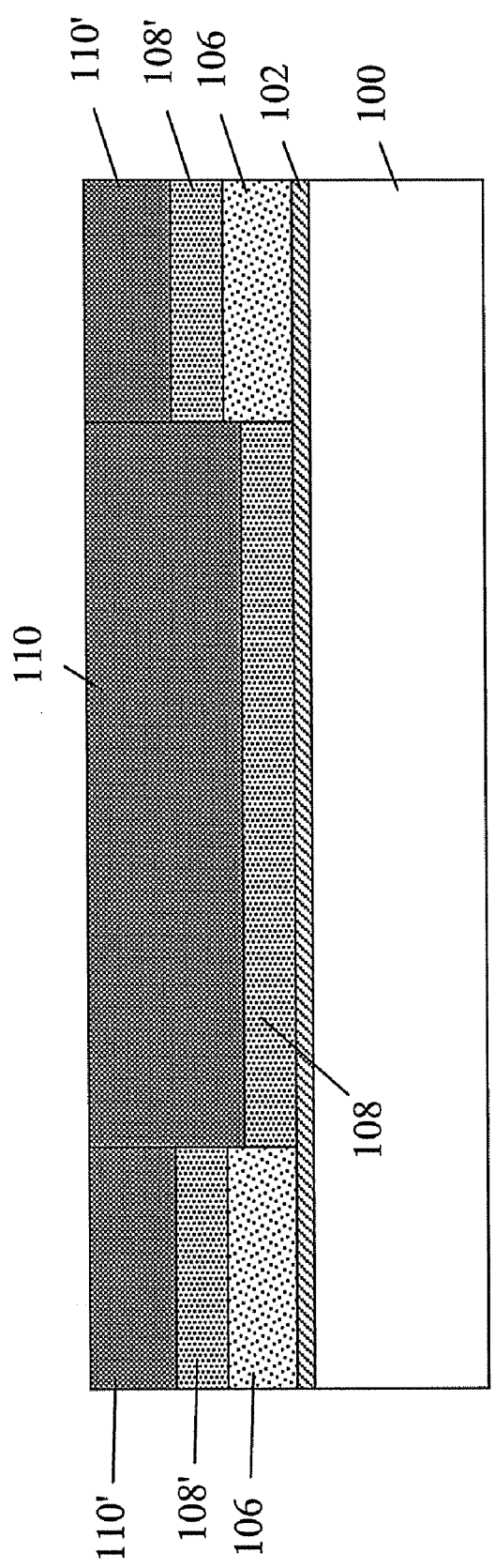

Then, as shown in FIG. 1(f), a ferroelectric/piezoelectric bottom gate dielectric layer material is formed over the device. The gate dielectric layer material may be, for example, a thin PZT film deposited by off-axis magnetron plasma sputtering. Similar to the bottom electrode layer material, the portions 110 of bottom gate dielectric PZT material deposited directly on the crystalline LMSO layer 108 are crystalline in structure and exhibit well-defined ferroelectric and piezoelectric properties, while the portions 110' of the PZT layer deposited on the amorphous LMSO layer 108' become themselves amorphous and non-ferroelectric/non-piezoelectric. Thus, the amorphous PZT layer 110' is non-ferroelectric/non-piezoelectric, while the crystalline PZT layer 110 defines the bottom gate dielectric of the device.

Figure 1G:
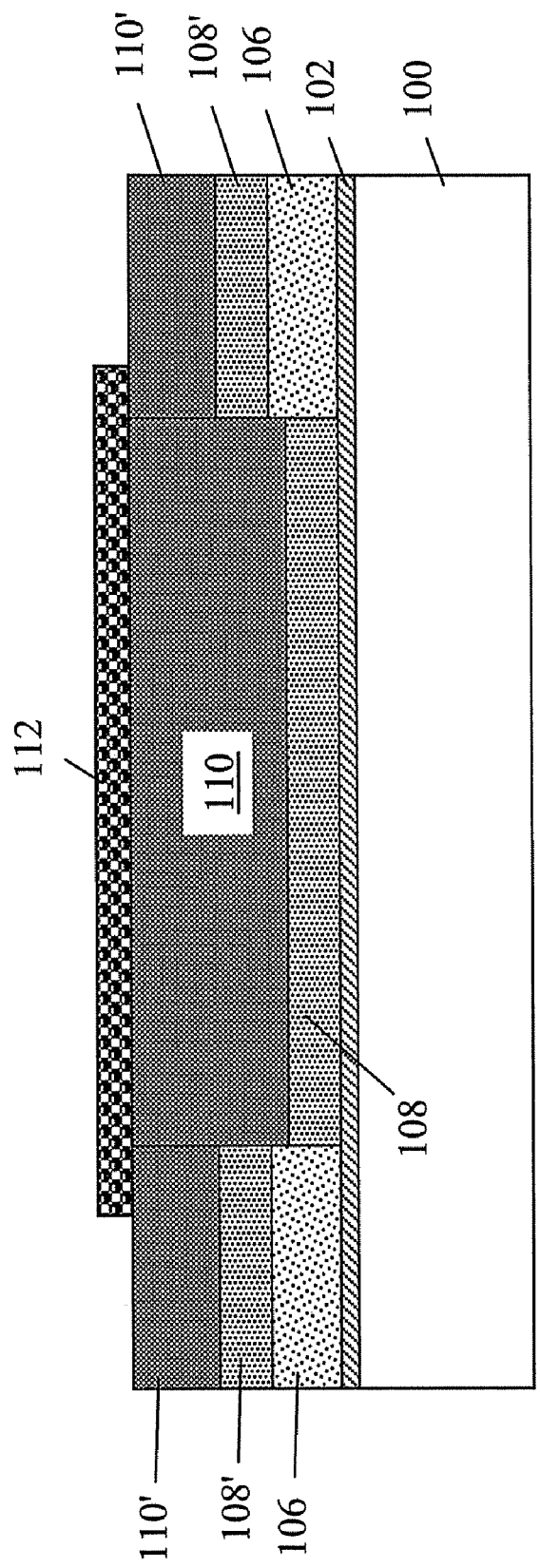
Figure 1H:
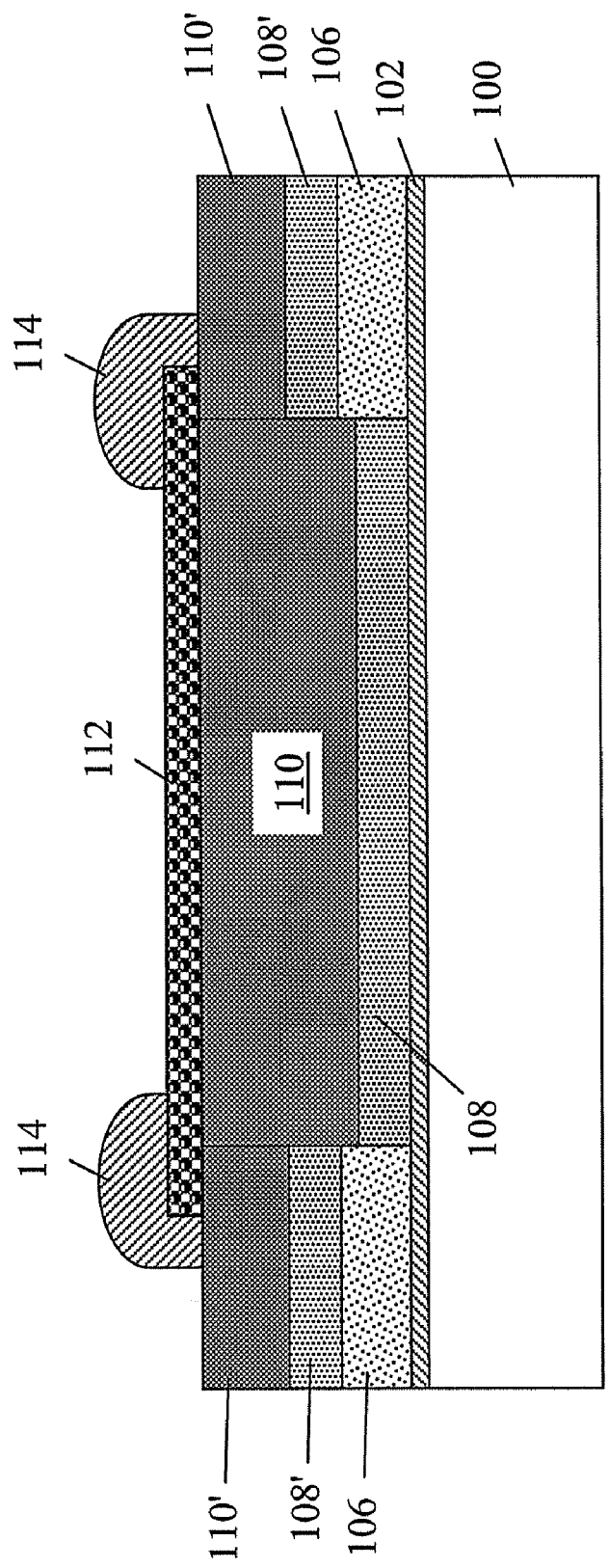

FIG. 1(g) illustrates the formation of bi-layer graphene over the device, followed by patterning and etching to define the active channel region 112 of the device. The bi-layer graphene may be formed over the PZT material in any suitable manner known in the art, such as by deposition or physical transfer, for example. In addition, a mask for producing the desired pattern for the channel region 112 may comprise, for example, poly (methyl methacrylate) (PMMA), with unwanted areas of bi-layer graphene etched away by oxygen plasma. Then, in FIG. 1(h), metal source/drain contacts 114 to the graphene channel 112 are formed. The metal contacts 114 may be formed by any suitable process, such as blanket deposition and etch, or by lithography resist patterning, deposition and lift-off, for example. In addition, exemplary metals for the source drain contacts 114 may include, but are not necessarily limited to, gold (Au), palladium (Pd) and platinum (Pt).

Figure 1I:
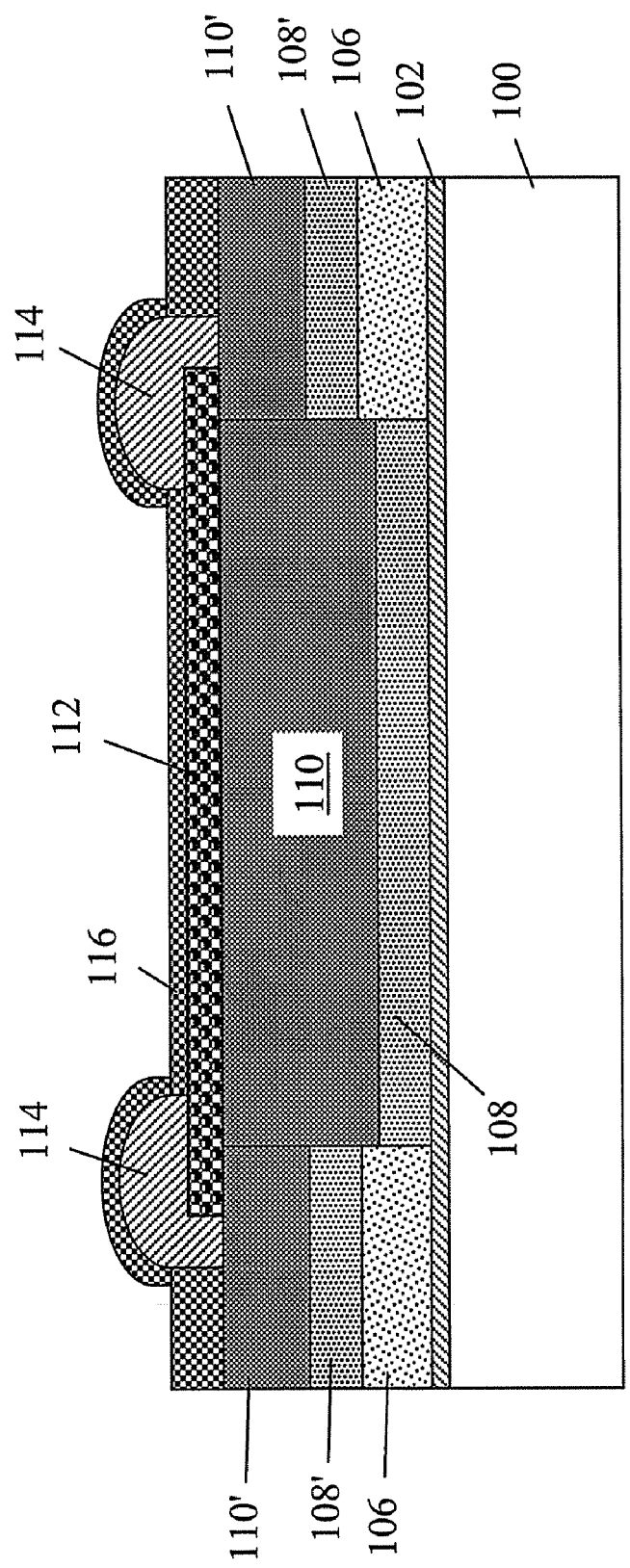
Figure 1J:
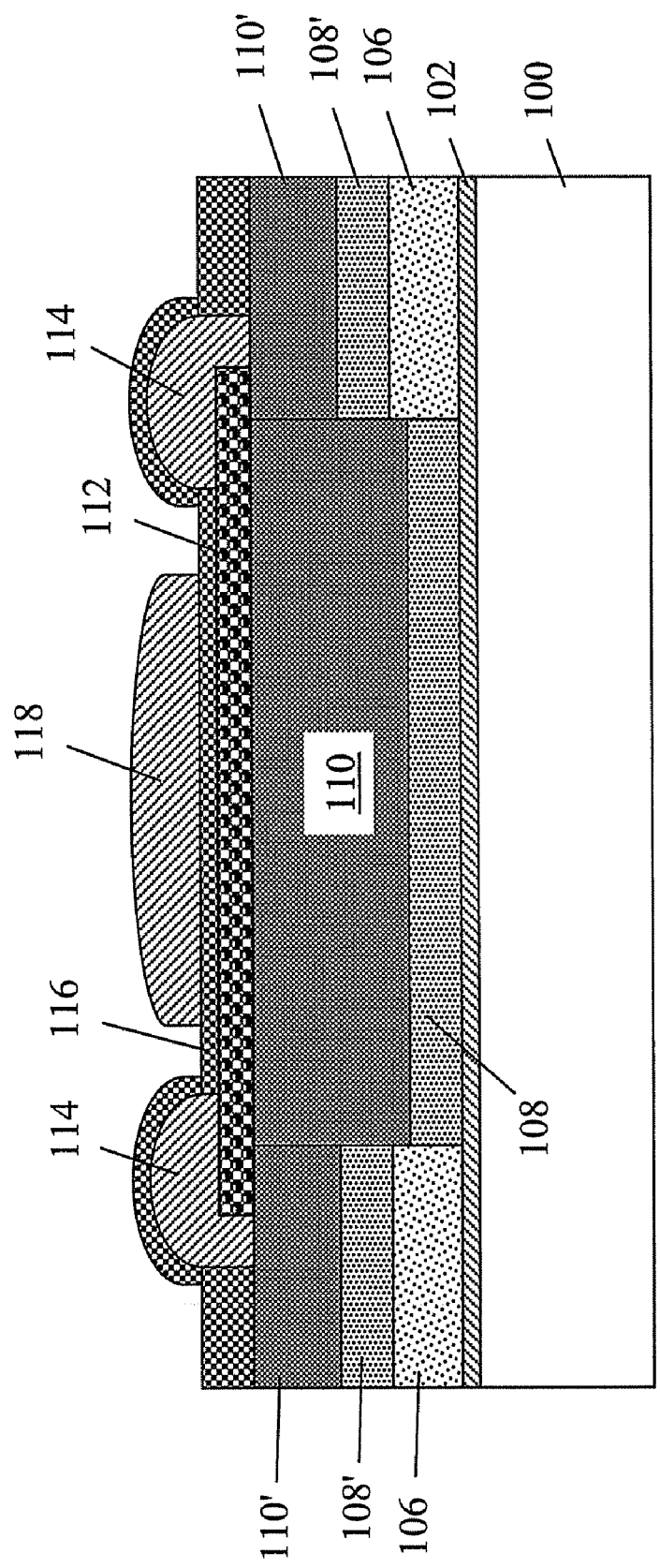

After formation of the source drain contacts 114, a top gate dielectric layer 116 is formed over the source/drain contacts 114 and the bi-layer graphene channel 112, as shown in FIG. 1(i). Exemplary top gate dielectric materials include oxides, but are not necessarily limited to, $Al_2O_3$, $SiO_2$, and $HfO_2$, deposited by, for example, atomic layer deposition (ALD) or physical vapor deposition (PVD) techniques. Finally, as shown in FIG. 1(j), a top gate electrode 118 is formed on the top gate dielectric layer 116 and over the channel 112. The top gate electrode 118 may be of the same material and formed in the same manner as the source/drain electrodes 114.

Figure 2:
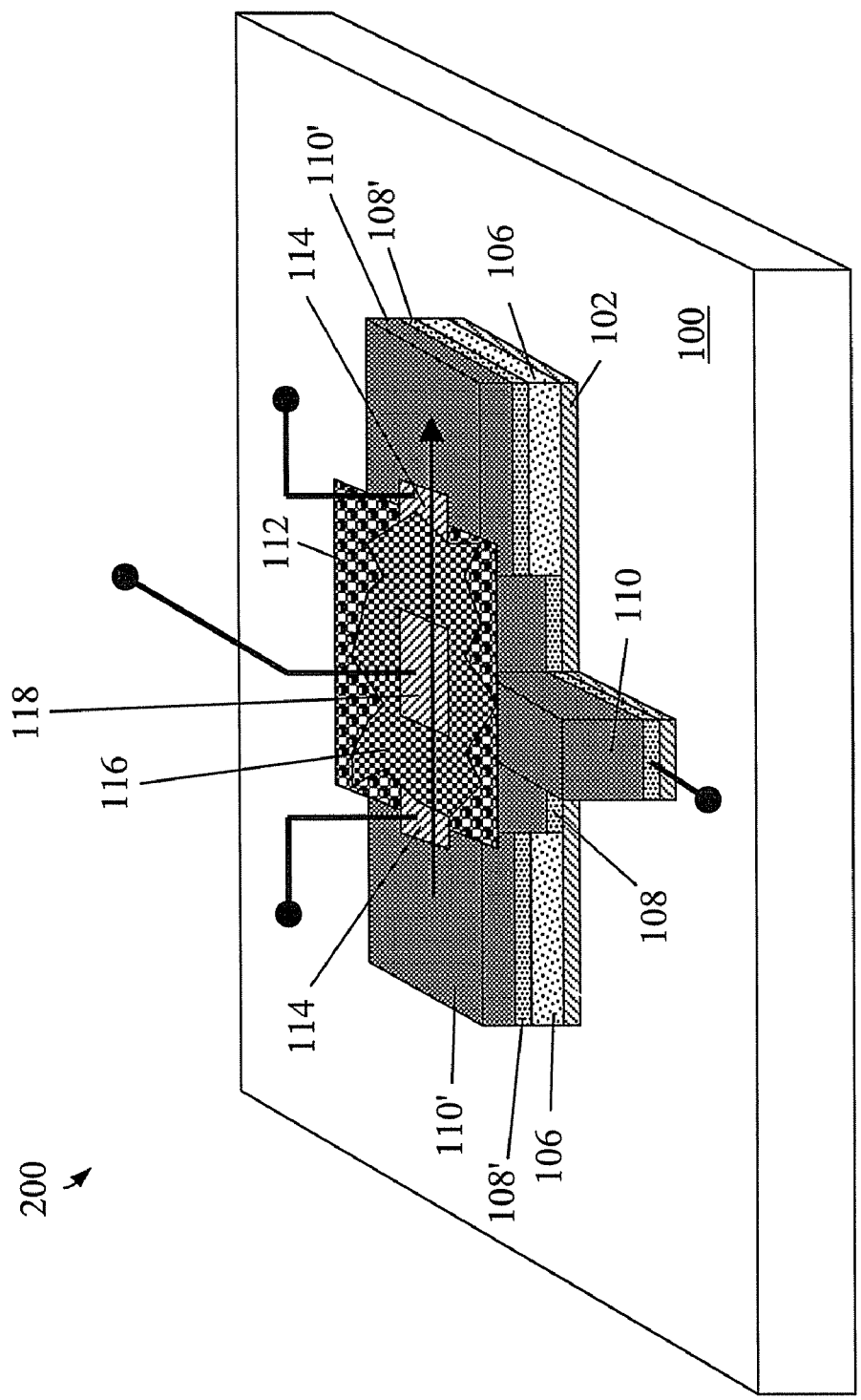
FIG. 2 is a perspective view of a tunable bandgap graphene transistor device, similar to that fabricated in the process flow FIGS. 1(a) through 1(j)
Figure 3:
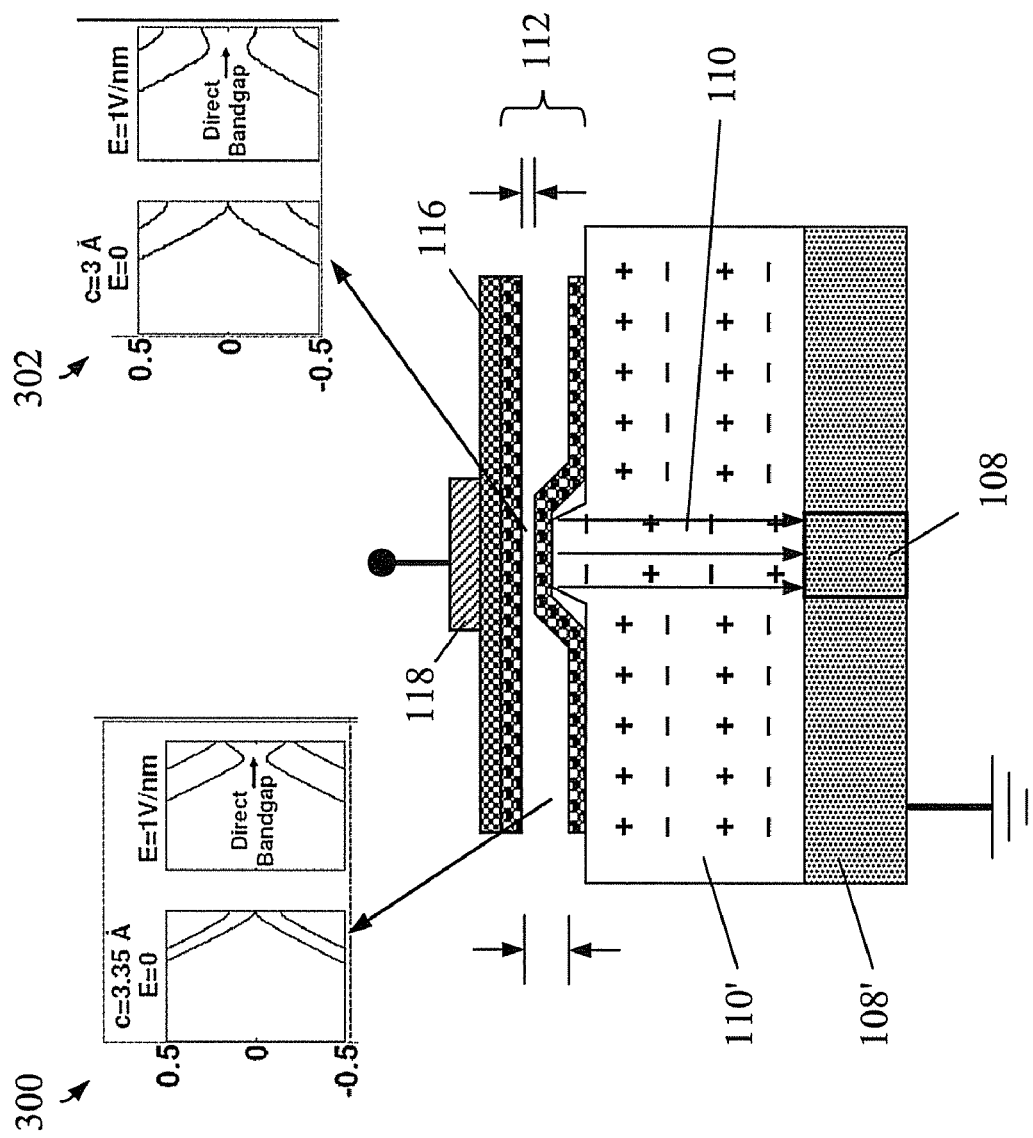
FIG. 3 is a cross sectional view illustrating the bandgap modulation of the bi-layer graphene transistor device.

Operation of the device thus formed may be further understood with reference to FIGS. 2 and 3. FIG. 2 is a perspective view of a tunable bandgap graphene transistor device 200, similar to that fabricated in the process flow FIGS. 1(a) through 1(j) described above. In FIG. 2, the top gate dielectric layer 116 is shown partially recessed so as to indicate the location of the source/drain electrodes 114 located thereunderneath. The arrow in FIG. 2 indicates the direction of current when the bi-layer graphene channel 112 is bandgap modulated to a conducting state through an applied voltage across the top and bottom gate electrodes 118, 108, and a suitable voltage is applied across the source and drain electrodes 114.

FIG. 3 is a cross sectional view illustrating the bandgap modulation of the bi-layer graphene transistor device. As is shown, the applied voltage between the top gate electrode 118 and conductive bottom gate electrode 108 results in an expansion of the crystalline PZT material (bottom gate dielectric 110) due to piezoelectric effects. This increase in PZT thickness causes a strain in the bi-layer graphene channel 112, locally reducing the interlayer spacing. It should be appreciated that the deformation shown in FIG. 3 is greatly exaggerated for purposes of illustration. For example, while the nominal interlayer distance within the bi-layer in the normal state is about 3.35 angstroms (Å), the modulated interlayer distance due to the piezoelectric expansion may be around 3.0 Å. At the same time, an electric field between graphene layers can be induced by biasing the top and bottom gate electrodes 118, 108 at different voltages. The combination of the strain and electric field inside the bi-layer graphene channel 112 accordingly results in a practical bandgap in graphene channel, leading to a high on/off ratio required for digital applications.

By way of comparison, the bandgap diagram 300 in the left portion of FIG. 3, corresponding to a region of the bi-layer graphene where no interlayer spacing reduction occurs, reflects a slight bandgap in the presence of an applied electric field on the order of about E=1V/nm. In contrast, the bandgap diagram 302 in the right portion of FIG. 3, corresponding to locations where the expanded PZT material reduces the interlayer spacing, reflects a practical bandgap (on the order of 300 meV) in the presence of the same applied electric field.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of implementing bandgap tuning of a graphene-based switching device, the method comprising:
subjecting a bi-layer graphene to an electric field while simultaneously subjecting the bi-layer graphene to an applied strain that reduces an interlayer spacing between the bi-layer graphene, thereby creating a bandgap in the bi-layer graphene;
creating the electric filed by applying a voltage across a dielectric material in contact with the bi-layer graphene, the dielectric material having ferroelectric and piezoelectric properties such that the dielectric material expands to create the applied strain on the bi-layer graphene, wherein the electric field is applied between a top gate electrode disposed above the bi-layer graphene and a bottom gate electrode disposed below the dielectric material;
wherein the dielectric material comprises lead zirconate titanate (PZT), and wherein the bottom gate electrode comprises crystalline lanthanum strontium manganite (LSMO) upon which the PZT is formed.

2. A method of implementing bandgap tuning of a grapheme-based switching device, the method comprising:
subjecting a bi-layer graphene to an electric field while simultaneously subjecting the bi-layer graphene to an applied strain that reduces an interlayer spacing between the bi-layer graphene, at a localized region thereof, thereby creating a bandgap in the bi-layer graphene at the localized region; and
creating the electric field by applying a voltage across a dielectric material in contact with the bi-layer graphene, the dielectric material having ferroelectric and piezoelectric properties such that the dielectric material expands to create the applied strain on the bi-layer graphene at the localized region.

3. The method of claim 2, wherein the electric field is applied between a top gate electrode disposed above the bi-layer graphene and a bottom gate electrode disposed below the dielectric material.

4. The method of claim 2, wherein the switching device comprises a field effect transistor (FET), with the bi-layer graphene defining a channel region between a pair of source and drain electrodes.

5. The method of claim 3, wherein the dielectric material comprises lead zirconate titanate (PZT).

6. The method of claim 5, wherein the switching device comprises a field effect transistor (FET), with the bi-layer graphene defining a channel region between a pair of source and drain electrodes, and wherein the FET has a top gate dielectric layer formed over the source and drain electrodes.

7. The method of claim 5, wherein the top gate dielectric layer comprises an oxide selected from the group of: $Al_2O_3$, $SiO_2$, and $HfO_2$.

8. The method of claim 5, wherein first portions of the bottom electrode layer are crystalline in structure and electrically conductive, and second portions of the bottom electrode layer are amorphous and insulating.

9. The method of claim 5, wherein first portions of the bottom gate dielectric layer on the first portions of the bottom electrode are crystalline in structure and exhibit ferroelectric and piezoelectric properties, while second portions of the bottom gate dielectric layer on the second portions of the bottom electrode layer are amorphous, non-ferroelectric and non-piezoelectric.

* * * * *